United States Patent [19]

Van Zeghbroeck

[11] Patent Number: 5,140,152

[45] Date of Patent: Aug. 18, 1992

[54] FULL DUPLEX OPTOELECTRONIC DEVICE WITH INTEGRAL EMITTER/DETECTOR PAIR

[75] Inventor: Bart J. Van Zeghbroeck, Boulder, Colo.

[73] Assignee: The University of Colorado Foundation, Inc., Boulder, Colo.

[21] Appl. No.: 708,952

[22] Filed: May 31, 1991

[51] Int. Cl.$^5$ ............................................. H01J 40/14
[52] U.S. Cl. ........................... 250/214 A; 250/211 J; 250/227.24; 357/19; 357/30
[58] Field of Search .................... 250/227.24, 227.11, 250/227.21, 551, 214 A, 214 R, 211 J, 211 R; 357/17, 19, 30 M, 30 P, 30 Q, 30 B; 307/311; 359/113, 151, 154, 188, 195

[56] References Cited

U.S. PATENT DOCUMENTS

| | | |
|---|---|---|
| 4,733,094 | 3/1988 | Carpentier et al. . |
| 4,766,471 | 8/1988 | Ovshinsky et al. ............... 357/19 |
| 4,773,074 | 9/1988 | Hunsperger et al. . |
| 4,790,620 | 12/1988 | Niwayama et al. ............... 357/19 |
| 4,833,511 | 5/1989 | Sugimoto ............................ 357/19 |
| 4,851,695 | 7/1989 | Stein . |
| 4,857,746 | 8/1989 | Kuhlmann et al. . |
| 4,948,960 | 8/1990 | Simms et al. . |
| 4,967,241 | 10/1990 | Kinoshita et al. . |

OTHER PUBLICATIONS

B. J. Van Zeghbroeck, Ch. Harder, H. P. Meier & W. Walter, Photon Transport Transistor, "Proced. of IEDM", 1989, pp. 543–546.

Primary Examiner—David C. Nelms
Assistant Examiner—K. Shami
Attorney, Agent, or Firm—Earl C. Hancock; Francis A. Sirr

[57] ABSTRACT

A semiconductor optoelectronic device provides full duplex data communication over a single optical fiber. The semiconductor device comprises a unitary P-N light emitting portion and an N-I-P photodiode portion. The light emitting portion and the photodiode portion share a common electrode for connection to operating voltage sources. The second electrode of the light emitting portion contains a window that is associated with one end of the optical fiber. A source of operating voltage for the light emitting portion is connected to the common electrode, and through data controlled switch means and a first resistance means to the second electrode of the light emitting portion. A source of operating voltage for the photodiode portion is connected to the common electrode, and through a second resistance means to a second electrode of the light emitting portion. Differential amplifier means is connected to receive the voltage developed across the first and second resistance means. The output of the differential amplifier means is a measure of the any data-containing light transmission that may be received from the end of the optical fiber, independent of the state of energization of the light emitting portion.

26 Claims, 2 Drawing Sheets

FULL DUPLEX OPTOELECTRONIC DEVICE WITH INTEGRAL EMITTER/DETECTOR PAIR

DESCRIPTION

This invention relates to the field of optical systems and elements, and more particularly to optical systems and elements having a light transmitting optical fiber that is associated with a semiconductor light emitting junction and a light responsive device in a manner so as to provide full duplex data communication over the optical fiber.

BACKGROUND OF THE INVENTION

The term full duplex data communication as used herein is intended to mean the simultaneous transmission of data in both directions over a communication means, in this case an optical fiber, i.e. a filament that provides a two way path for data-containing light to travel between the two ends of the filament.

It is known in the art to provide semiconductor means that is operable to inject data-containing light into one end of an optical fiber, and to provide semiconductor means that is operable to detect the data-containing light that issues from the other end of the fiber.

For example, U.S. Pat. No. 4,733,094 describes a bidirectional or full duplex optoelectronic arrangement wherein a discrete (i.e. individually distinct) LED and a discrete photodiode are mounted side by side within a box. One or more mirrors are provided so that the LED and the photodiode are capable of simultaneously emitting light to an optical fiber, and receiving light from the optical fiber.

U.S. Pat. No. 4,773,074 describes a unitary emitter-receiver semiconductor diode device for direct coupling to an optical fiber. In this unitary structure, a double heterostructure diode and a waveguide photodiode are selectively switched between a light emission mode of operation or a light receiving mode of operation. Application of a reverse bias causes the device to operate as a light receiver. Application of a forward bias causes the device to operate as a light emitter. U.S. Pat. No. 4,948,960 is generally similar in its teaching.

A feature of the present invention is the use of an integrated, single unit, semiconductor light emitting device that is mounted on top of a photodiode. Of interest in this regard is the publication *Proceedings of the IEDM 89*, 1989, at pages 543-546, which describes an electroptic device that consisting of a light emitting device (LED) mounted on top of a photodiode, to form a unitary semiconductor structure. This publication is incorporated herein by reference for the purpose of indicating the background of the invention.

Also of general interest is U.S. Pat. No. 4,766,471 which shows a light transmissive conduit that is formed to interconnect a light emitter and a light detector.

In addition, U.S. Pat. No. 4,851,695 discloses an optoelectronic coupling element wherein an infrared semiconductor light emitting chip is mounted on top of an infrared semiconductor light receiving chip, to thereby form a unitary coupling element; U.S. Pat. No. 4,857,746 describes an optocoupler wherein a substrate member is fabricated to contain a light transmitter and a light receiver; and U.S. Pat. No. 4,967,241 discloses a unitary semiconductor light emitting device and photosensor, the light emitting device being associated with an optical fiber cable and operating to inject light into the end of the optical fiber.

In the device of U.S. Pat. No. 4,967,241, a semiconductor substrate member is fabricate to have the light emitting device on the bottom surface thereof, and to have an upwardly extending open window therein. The light emitting device emits light in an upward direction, through this window and into the end of the optical fiber. A photosensor is formed in the side wall of this window, so as to receive a portion of the light that is generated by the light emitting device. The resulting output signal that is provided by the photosensor is connected as one input to a differential amplifier, and the output of the differential amplifier operates to maintain the light output of the light emitting device constant.

While the devices of the prior art as exemplified above are generally acceptable for their intended purposes, the need remains for a physically compact semiconductor optoelectronic device that provides for full duplex data communication over a single optical fiber in a reliable and an efficient manner.

SUMMARY OF THE INVENTION

The present invention provides a physically compact, unitary, and efficient optoelectronic semiconductor device that is operable to provide full duplex data communication over a single optical fiber.

In general terms, the semiconductor device of the invention comprises a unitary light emitting area or volume, and a light detector or photodiode area or volume. The light emitting area and the photodiode area share a common electrical electrode or connector that is connected to two operating voltage sources, one source for the light emitting area and one source for the photodiode area.

A second connector for the light emitting area contains a window that is physically associated in close proximity to one end of a data transmission optical fiber. The source of operating voltage for the light emitting area is connected to the common connector, and through a first resistance means to the second connector of the light emitting area.

The source of operating voltage for the photodiode area is connected to the common connector, and through a second resistance means to a second connector that is provided for the light emitting area.

Differential amplifier means is connected to receive the voltage that is developed across the first and second resistance means. The output of the differential amplifier means is a measure of the any data-containing light that may be received from a remote source and which accordingly is emitted from the end of the optical fiber.

An object of the invention is to provide full duplex communication between two physical locations by means of an elongated optical fiber that extends between the two locations. A first end of the fiber is positioned adjacent to the light emitting junction of the invention, such that upon energization or biasing of the junction, the junction operates to emit light into the first end of the fiber for transmission to the second end of the fiber. The light emitting junction is formed as a single unit with the light sensor of the invention, such that the junction, when energized, also emits light onto the light sensor. Light that may be injected into the second end of the fiber, and thus emitted from the first end of the fiber, is also sensed by the light sensor.

An embodiment of a unitary semiconductor emitter/sensor apparatus of the invention generally comprises a semiconductor device having multiple layers arranged in the sequence (1) a first layer of AlGaAs doped to have a conductivity of one polarity, (2) a second layer of AlGaAs doped to have an opposite conductivity polarity, (3) a third layer of AlGaAs doped to have a conductivity of the opposite polarity, (4) a fourth undoped layer of GaAs, and (5) a fifth layer of AlGaAs doped to have conductivity of the one polarity, wherein the first and second layers form a light emitting junction, and wherein the third, fourth and fifth layers form a light sensor.

DC voltage sources are provided for the light emitting junction and the light sensor. The currents flowing relative to the junction and sensor are detected in a manner such that an output is produced independent of the state of energization of the light emitting junction, i.e. the output is indicative only of light that is transmitted into the second end of the fiber and which issues from the first end thereof onto the light sensor.

These and other objects and advantages of the invention will be apparent to those of skill in the art upon reference to the following detailed description, which description makes reference to the drawing.

DETAILED DESCRIPTION OF THE INVENTION

Figure 1:
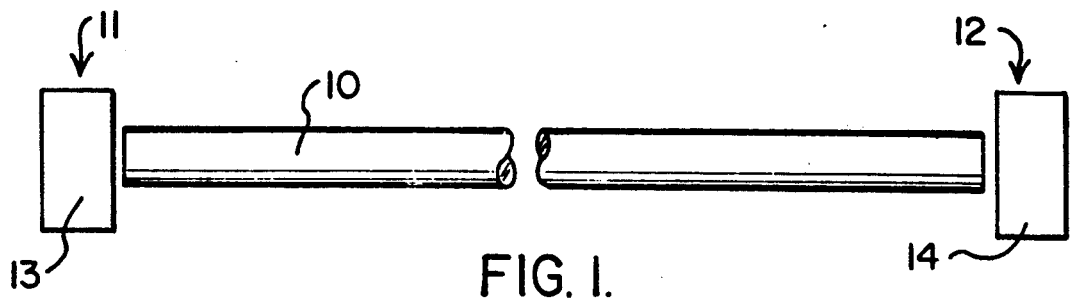
FIG. 1 is a view of a single optical fiber extending between two physically spaced locations, between which locations full duplex optical communication is provided by operation of two devices in accordance with the invention, with each end of the optical fiber including identical optoelectronic devices in accordance with the invention.

The present invention provides full duplex optical communication over an optical fiber. FIG. 1 is a view of a single optical fiber 10 extending between two physically spaced locations 11 and 12. Full duplex optical communication is provided between locations 11,12 by operation of two optoelectronic devices 13 and 14, each of which are constructed and arranged in accordance with the invention. Devices 13 and 14 are identical in their construction and arrangement, thus only one of the devices 13,14 will be described in detail with reference to FIG. 2. As will be appreciated, the communication system of FIG. 1 is not shown to scale, and the physical size and/or spacing of the system shown in FIG. 1 is not to be considered critical to the invention.

As used herein the term optical communication is intended to be taken in its broadest sense, the only limitation being that the electromagnetic radiation that propagates between the ends of optical fiber 10 must be compatible with the operational characteristics of fiber 10 and with the operational characteristics of optoelectronic devices 13,14.

While the invention is of general utility wherever full duplex optical communication is required between two physical locations such as 11,12, examples include communication over relatively short distances, including optical interconnection of computer components and/or systems.

Figure 2:
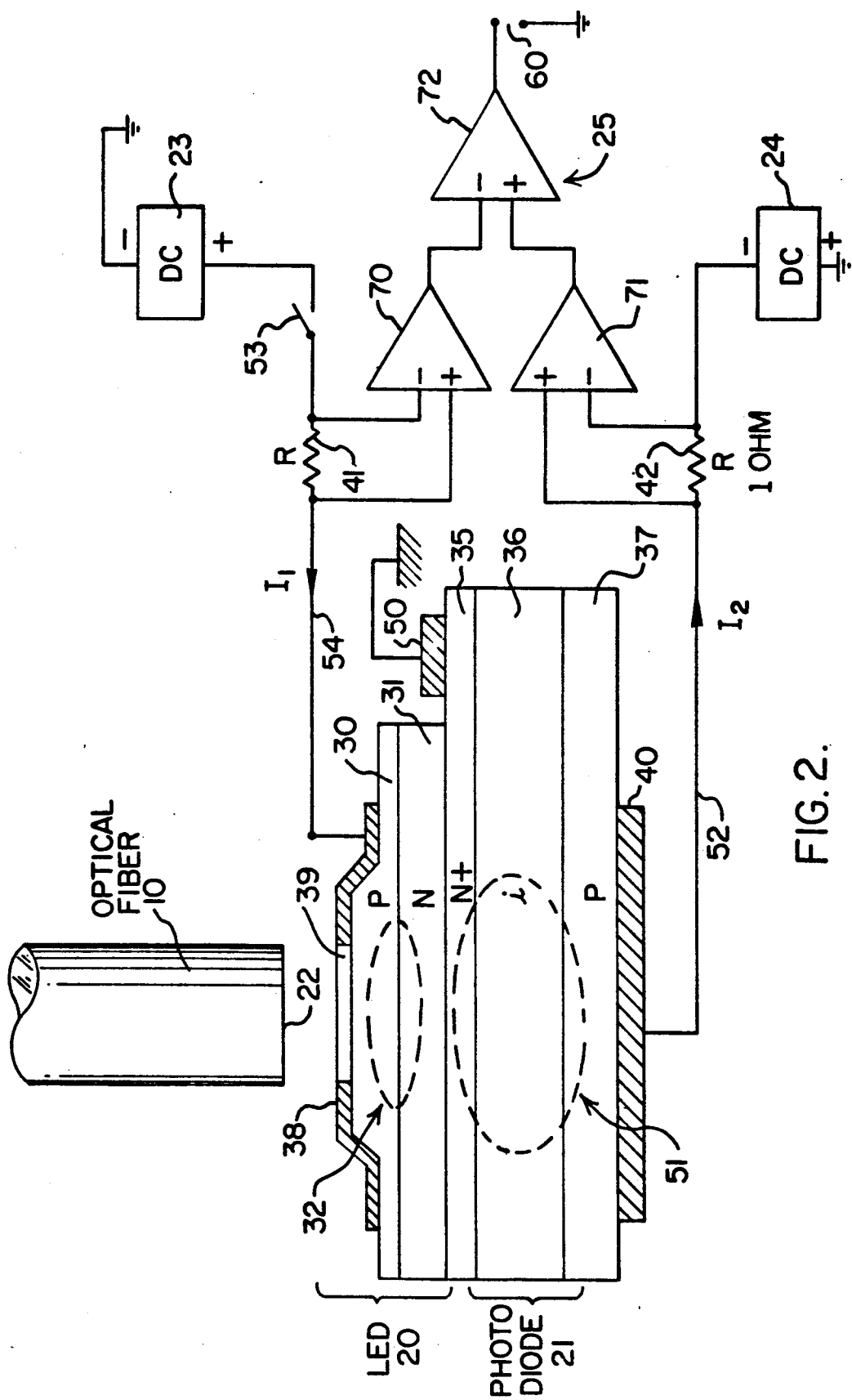
FIG. 2 is a view of one of the two identical optoelectronic devices of FIG. 1, including a unitary semiconductor device structure comprising a light emitting diode (LED) portion and a photodiode portion, including one end of the optical fiber of FIG. 1 in close proximate to the LED portion, and including two external power supplies and a signal detection electronic circuit connected to the semiconductor device structure.

FIG. 2 is an enlarged view that includes one of the two identical optoelectronic devices 13,14 of FIG. 1. The device of FIG. 2 is capable of simultaneously emitting light to optical fiber 10 and receiving light from optical fiber 10. Light coming from optical fiber 10 is mainly absorbed in the device's photodiode portion 21. The light that is emitted to optical fiber 10 by operation of the device's light emitting diode (LED) portion 20 comprises a smaller portion of the total quantity of light that is generated within the device by operation of LED 20. A representative value for the light gathering efficency of photodiode portion 21 is about 80 percent, whereas a representative value for the light emitting portion 20 is about 2 percent.

As a feature of the invention, the unitary semiconductor structure provides two distinct devices, namely LED portion 20 and photodiode portion 21, that share a common electrode 50.

The device of FIG. 2 also includes one end 22 of FIG. 1's optical fiber 10. Fiber end 22 is shown as being located in close physical proximate to LED portion 20. Within the spirit and scope of the invention, a lens may be provided adjacent to the end fiber end 22. The device of FIG. 2 also includes two external DC power supplies 23 and 24 of the polarity shown, as well as differential amplifier type signal detection electronic circuitry 25, all of which are connected to the three electrodes 38,50,40 of the device's unitary LED/photodiode semiconductor structure. LED 20 is driven, activated or energized by source 23 upon the closing of a data controlled switch 53, whereas photodiode 21 is continuously biased by source 24. An exemplary voltage magnitude for source 23 is in the range of about −1.5 to 2.0 volts, whereas an exemplary voltage magnitude for source 24 is in the range of from 0.0 to 1.0 volt.

While physical size is not critical to the invention, in an embodiment of the invention, optical fiber 10 was about 50 microns in diameter, and LED 20 was somewhat smaller, to thereby ensure achieving a relatively uniform light coupling ratio between end 22 and LED 21, independent of fiber-to-LED physical alignment accuracy.

The device's upper LED portion 20 comprises a light emitting junction that is formed by P layer 30 and N layer 31. The general area or volume of LED 20 that is indicated by dotted circle 32 is intended to identify, without limitation thereto, the light emitting region of LED 20. As will be appreciated by those skilled in the art, light or electromagnetic radiation that is generated in LED region 32 propagates outward in all directions from light region 32 when LED 20 is electrically activated by the closing of switch 53.

LED 20 is selectively activated whenever it is desired to inject light, and thus data, into the end 22 of optical fiber 10 for transmission to the other end of fiber 10. For purposes of simplicity, a switch 53 is shown in conductor 54 for the purpose of activating or energizing LED 20 by connecting power source 23 thereto. When switch 53 is in its closed state, a DC current flows in conductor 54 and resistor or impedance means 41, the direction of current flow being indicated by the arrow that is associated with conductor 54. In actual practice, switch 53 comprises a more complex means whereby binary data is encoded in any one of a number of well known coding techniques, in the form of on-off periods of LED 20.

Photodiode portion 21 is located directly under and in physical contact or engagement with LED portion 20. Photodiode 21 is an N-I-P device, comprising N+(i.e. a highly doped N layer) layer 35, I layer 36 and P layer 37. The general area or volume of photodiode portion 21 that is indicated by dotted circle 51 is intended to identify, without limitation thereto, the light absorbing or light sensitive region of photodiode 21. As will be appreciated by those skilled in the art, light or electromagnetic radiation that is generated in LED region 32, as well as light or electromagnetic radiation that is received from end 22 of optical fiber 10, propagates into region 51 and operates in conjunction with DC power source 24 to generate a DC current, and perhaps a DC current having an AC component, that flows in external conductor 52 and resistor or resistor means 42, the direction of this current flow being indicated by the arrow that is associated with conductor 52. While not critical to the invention, as can be seen from FIG. 2, the polarity of source 24 is such that photodiode 21 is reverse biased by that source.

As a feature of the invention, N+ layer 35 comprises a layer that is generally transparent to both the light that is generated by LED 20 and the light that is transmitted by optical fiber 10. N+ layer 35 is electrically connected to common electrode or conductor 50, and that conductor is grounded. By way of conductor 50, the grounded terminals of sources 23 and 24 are connected to LED 20 and to photodiode 21, respectively.

The specific semiconductor layer configuration of the device as shown in FIG. 2 is not to be considered to be a limitation on the invention. This specific device is shown as a P-N-N-I-P device, wherein the first two P-N layers comprise a semiconductor electromagnetic radiation generating means 20, and wherein the remaining three N-I-P layers comprise a semiconductor radiation sensitive means 21. Other five-layer configurations within the spirit and scope of the invention include P-N-P-I-P and N-P-N-I-P devices. Four-layer configurations within the spirit and scope of the invention include N-P-I-P and P-N-I-P devices.

LED 20 includes a second electrode 38 that is electrically connected to P layer 30. Electrode 38 includes a generally centrally disposed window portion 39 that is also generally transparent or open to the light that is generated by LED 20 and to light that is transmitted by optical fiber 10. For example window portion 39 may be formed by using a well known finger, mesh or grid physical structure for electrode 38. In accordance with this invention, window portion 39 of electrode 38 is closely spaced to the end 22 of optical fiber 10. While close spacing is preferred, this spacing parameter is not critical to the invention, and in accordance with the invention a lens may be located within this spacing if desired.

Photodiode 21 includes a second electrode 40 that physically contacts and makes electrical contact to P layer 37. As shown in FIG. 2, power source 23 is connected to electrode 38 by way of a resistor or impedance means 41, whereas power source 24 is connected to electrode 40 by way of a resistor or impedance means 42.

While the resistance values of resistors 41,42 are not critical to the invention, as a feature of the invention these resistance values are selected as follows. Resistor 42 is first selected to be of a relatively low value, for example 1 ohm. Once the value of resistor 42 is selected, the value of resistor 41 is determined by first ensuring that no light is being received by photodiode 21, i.e. photodiode 21, although energized by source 24 through resistor 42, is in a dormant state. Switch 53 is then closed to activate LED 20. The value of resistor 41 is now adjusted or varied until the output 60 of differential amplifier means 25 equals zero. The value at which output 60 equals zero is the optimum operating value for resistor 41. Generally speaking, the selected value of resistor 41 will vary as a function of the extent to which light generated by LED 20 is coupled to, or received by, photodiode 21. The higher the magnitude of light that is coupled between LED 20 and photodiode 21, the higher will be the selected magnitude of resistor 41.

As stated previously, the P-N construction of LED 20, and the N-I-P construction of photodiode 21 as shown in FIG. 2 are not to be considered a limitation on the invention. As is well known by those of skill in the art, these devices can readily be constructed to be P-N and P-I-N devices, if desired, in which case the polarity of sources 23,24 would be reversed from that shown in FIG. 2.

The manner of fabricating the unitary LED/photodiode semiconductor structure of FIG. 2 is well known to those of skill in the art, and the exact manner of fabrication is not considered to be critical to the invention. The structure of FIG. 2 would be grown on a GaAs substrate (i.e. on layer 37 of FIG. 2) using a lattice matched GaAs/AlGaAs material system.

While the use of a GaAs/AlGaAs material system is preferred in fabricating LED 20 and photodiode 21, it is contemplated that other material systems can be used in accordance with the invention. In addition, instead of using a vertically emitting LED, as shown in FIG. 2, a vertical or surface emitting laser can be used to construct the light emitting portion 20 of a semiconductor device within the invention.

In an exemplary embodiment of the invention, the unitary LED and photodiode of FIG. 2 was obtained by growing the unitary semiconductor structure using the well known molecular beam epitaxy (MBE) process.

In this exemplary embodiment, LED 20 comprised a single quantum well graded index separate confinement heterojunction that was formed by a P layer 30 consisting of beryllium doped AlGaAs about 2 micro meters thick, and by an N layer 31 consisting of a silicon doped AlGaAs layer about 2 micro meters thick.

Photodiode 21 comprised a P layer 37 that consisted of beryllium doped GaAs about 1 micro meter thick. Intrinsic layer 36 consisted of undoped GaAs, and N+ layer 35 consisted of a highly silicon doped (i.e. about $10^{18}$ cm$^{-3}$) AlGaAs layer about 1 micro meter thick, and containing about 10% Al.

Electrode 38 comprised a three layer electrode, having a Ti layer located adjacent to and in physical contact with P layer 30, having an intermediate Pt layer, and having a top disposed Au layer to which conductor 54 was electrically connected.

Electrode 50 also consisted of a three layer electrode, having a Ge layer located adjacent to and in physical contact with N+ layer 35, having an intermediate Ni layer, and having a top disposed Au layer which was electrically connected to the grounded conductor shown in FIG. 2.

The last of the three electrodes, electrode 40, consisted of a three layer electrode, having a Zn layer located adjacent to and in physical contact with P layer 37, having an intermediate Ni layer, and having a bottom disposed Au layer which was electrically connected to conductor 52.

Amplifier means 25 of FIG. 2 comprises a circuit means for detecting the current flowing between said DC voltage sources 23 and 24 and LED 20 and photodiode 21, respectively. This circuit means operates to provide an output 60 independent of light that may be received by photodiode 21 due to selective energization of LED 20, such that output 60 is indicative only of data-containing light emitted into the other end of fiber 10, and thus radiated from end 22.

Thus, amplifier means 25 comprises a circuit means whereby data-containing light currently being received from the end 22 of optical fiber 10, which light is sensed or detected by photodiode 21, is converted to an electrical signal at output 60.

The construction and arrangement of FIG. 2 allows LED 20 to be controlled independent of incoming data-containing light, and also allows the detection of the incoming data-containing light by calculating the difference between the two currents that flow in conductors 52 and 54 at any one time. Of course, if data-containing light is not being generated by operation of LED 20 simultaneously with data-containing light being received from optical fiber 10, then the current flowing in conductor 54 is zero, and the current flowing in conductor 52 is a direct measure of the data-containing light then being received from optical fiber 10.

Amplifier means 25 of FIG. 2 comprises three generally identical differential amplifiers 70,71,72 of well known internal construction. The noninverting input terminal of amplifiers 70 and 71 are connected to the ends of resistors 41,42 that are connected to semiconductor electrodes 38 and 40, respectively, whereas the inverting input terminal of each of these amplifiers is connected to the opposite end (i.e. the power supply end) of resistors 41 and 42, respectively.

In this way, the output of amplifier 70 is a direct measure of the magnitude of the current flowing in conductor 54 (i.e. the magnitude of the current that is energizing LED 20), and the output of amplifier 71 is a direct measure of the magnitude of the current that is flowing in conductor 52.

It will be recalled that the magnitude of the current flowing in conductor 52 is dependent upon the total quantity of light when activating photodiode 21, and that this total quantity of light may comprise (1) only light being received from optical fiber 10, or (2) only light being generated by energization of LED 20, or (3) a combination or sum of the light being received from optical fiber 10 and the light being generated by energization of LED 20.

The output of amplifiers 70 and 71 are connected to the noninverting input and inverting input, respectively, of the third differential amplifier 72. Thus, the output 60 of amplifier 72 comprises a measure of the difference between the outputs of amplifiers 70 and 71, i.e. a measure of the difference in the current flowing in conductors 54 and 52, respectively.

It will also be recalled that selection of the magnitude of resistor 41 relative to resistor 42 insured that for above condition (2), that is when photodiode 21 is receiving light from only the energized state of LED 20, output 60 equals zero, this being an indication that no data-containing light is being received from optical fiber 10 at that time.

Due to this selection of relative resistor values, when above condition (3) exists, that is when photodiode 21 is receiving light from both optical fiber 10 and from energization of LED 20, output 60 of amplifier 70 is a measure of the total quantity of light being received by photodiode 21, and output 60 of amplifier 71 is a measure of only the quantity of light then being received from fiber 10, since amplifier 72 operates to subtract the output of amplifier 70 from the output of amplifier 71, and the output 60 of amplifier 72 is thus a direct measure of only the data-containing light that is received from fiber 10.

When above condition (1) exists, that is when photodiode 21 is receiving light from only optical fiber 10, the output of amplifier 70 equals zero, and output 60 of amplifier 72 is again a direct measure of the output of amplifier 71 and of the received data-containing light.

Figure 3:
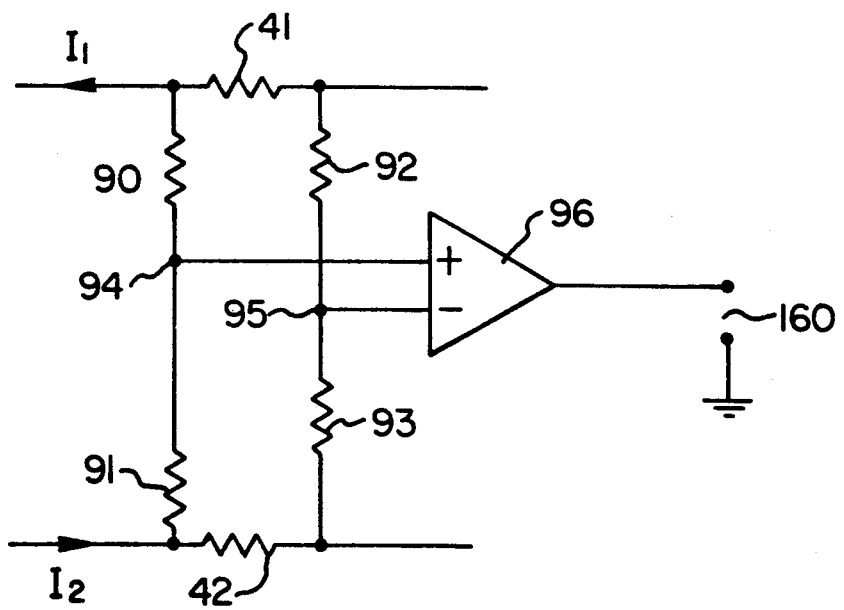
FIG. 3 presents an alternate form of signal detection electronic circuit that can be used in the arrangement of FIG. 2.

FIG. 3 presents an alternate form of detection electronic circuit that can be used in the arrangement of FIG. 2 to replace amplifiers 70,71,72. In this circuit arrangement, four resistors 90-93 are connected to bridge the opposite ends of resistors 41,42, as is shown, and the intermediate resistor junctions 94,95 are connected to the noninverting input and inverting input, respectively, of a differential amplifier 96 having an output 160 that corresponds to output 60 of FIG. 2. In this arrangement, resistors 90-93 are or relatively high and equal resistance values.

While the invention has been described in detail by making reference to preferred embodiments thereof, it known that those skilled in the art will readily visualize yet other embodiments that are within the spirit and scope of the invention. Thus it is intended that the invention be as is defined in the claims.

What is claimed is:

1. Apparatus providing full duplex data communication over an optical fiber, comprising;
   electrically energizable semiconductor electromagnetic radiation generating means having a first and a second boundary layer, said generating means when energized operating to produce electromagnetic radiation of a given characteristic,
   first electrical contact means electrically engaging said first boundary layer of said generating means,
   an elongated optical fiber having a first and a second end, and operable to bidirectionally transmit electromagnetic radiation of said given characteristic between said ends of said optical fiber,
   said optical fiber having said first end thereof physically associated with said first boundary layer of said generating means so as to receive electromagnetic radiation of said given characteristic upon energization of said generating means,
   electrically operable semiconductor electromagnetic radiation sensitive means sensitive to electromagnetic radiation of said given characteristic,
   said sensitive means having a first boundary layer in physical engagement with said second boundary layer of said generating means, to thereby form a layer interface between said generating means and said sensitive means, and said sensitive means having a second boundary layer,
   second electrical contact means electrically engaging said layer interface, third electrical contact means electrically engaging said second boundary layer of said sensitive means, first voltage source means for said generating means having an output terminal and a common terminal, second voltage source means for said sensitive means having an output terminal and a common terminal, common conductor means connecting the common terminals of said first and second voltage source means to said second electrical contact means, first conductor means including first impedance means connection said output terminal of said first voltage source means to said first electrical contact means, second conductor means including second impedance means connection said output terminal of said second voltage source means to said third electrical contact means, and electrical signal processing means connected to said first and second impedance means and operable to produce an output signal that is indicative of the difference in magnitude of a voltage across said first impedance means and a voltage across said second impedance means.

2. The apparatus of claim 1 including data controlled means operable to control energization of said generating means in accordance with data to be transmitted from said first end to said second end of said optical fiber.

3. The apparatus of claim 2 wherein said first and second impedance means comprise first and second resistance means, wherein current flow through said first resistance means is indicative of energization of said generating means by said data controlled means and of the quantity of electromagnetic radiation of said given characteristic being generated by said generating means as a result of said energization, and wherein current flow through said second resistance means is indicative of the total quantity of electromagnetic radiation of said given characteristic being received by said sensitive means.

4. The apparatus of claim 3 wherein said first and second resistors have resistance values such that said signal processing means is operable to produce an output signal whose magnitude is independent of energization of said generating means.

5. The apparatus of claim 3 wherein said first and second resistors have resistance values such that said signal processing means operates to produce an output signal whose magnitude is indicative of only a quantity of electromagnetic radiation of said given characteristic that is received from said first end of said optical fiber.

6. Full duplex radiation generating/detecting apparatus, comprising;

a multilayer semiconductor device, having layers thereof arranged in the following order, a first layer doped to have conductivity of one polarity, a second layer doped to have conductivity of a polarity opposite said one polarity, a third layer doped to have conductivity of said opposite polarity, a fourth undoped layer, a fifth layer doped to have conductivity of said one polarity, said first and second layers forming a junction which, when energized, operates to generate electromagnetic radiation, said third, fourth and fifth layers forming electromagnetic radiation sensing means sensitive to said electromagnetic radiation, and said second and third layers physically engaging to form an interface between said junction and said sensing means, first electrical source means for said junction having an output terminal and a common terminal, second electrical source means for said sensing means having an output terminal and a common terminal, common conductor means connecting said common terminals of said first and second electrical source means to said interface, first conductor means including first impedance means connection said output terminal of said first electrical source means to said first layer, second conductor means including second impedance means connection said output terminal of said second electrical source means to said fifth layer, and electrical signal processing means connected to said first and second impedance means and operable to produce an output signal that is indicative of the difference in voltage magnitude across said first impedance means and said second impedance means.

7. The apparatus of claim 6 wherein said one polarity is P and wherein said opposite polarity is N.

8. The apparatus of claim 7 wherein said first and second impedance means comprise first and second resistance means, wherein current flow through said first resistance means is indicative of current flowing to energize said junction and of the quantity of electromagnetic radiation being generated by said junction as a result of said energization, and wherein current flow through said second resistance means is indicative of the total quantity of electromagnetic radiation being received by said sensing means.

9. The apparatus of claim 8 wherein resistance magnitudes are selected for said first and second resistance means such that said signal processing means is operable to produce an output signal independent of the quantity of electromagnetic radiation generated by said junction.

10. The apparatus of claim 9, including;

an elongated optical fiber having a first and a second end, and operable to bidirectionally transmit electromagnetic radiation between the ends of said optical fiber, said optical fiber having said first end thereof physically associated with said first layer of said junction so as to receive electromagnetic radiation upon energization of said junction.

11. The apparatus of claim 10 including means operable to selectively energize said junction.

12. The apparatus of claim 6 wherein said one polarity is N and wherein said opposite polarity is P.

13. The apparatus of claim 12 wherein said first and second impedance means comprise first and second resistance means, wherein current flow through said first resistance means is indicative of current flowing to energize said junction and of the quantity of electromagnetic radiation being generated by said junction as a result of said energization, and wherein current flow through said second resistance means is indicative of the total quantity of electromagnetic radiation being received by said sensing means.

14. The apparatus of claim 13 wherein resistance magnitudes are selected for said first and second resistance means such that said signal processing means produces an output signal that is independent of the state of energization of said junction.

15. The apparatus of claim 14, including;
an elongated optical fiber having a first and a second end, and operable to bidirectionally transmit electromagnetic radiation between the ends thereof,
said optical fiber having said first end thereof physically associated with said first layer of said junction so as to receive electromagnetic radiation upon energization of said junction, and operating to transmit said electromagnetic radiation to the second end thereof.

16. The apparatus of claim 15 including means operable to selectively energize said junction.

17. Light emitting/sensing apparatus, comprising;
a semiconductor device having multiple layers arranged in the following sequence,
a first layer of AlGaAs doped to have conductivity of one polarity,
a second layer of AlGaAs doped to have conductivity of a polarity that is opposite to said one polarity,
a third layer of AlGaAs doped to have conductivity of said opposite polarity,
a fourth undoped layer of GaAs,
a fifth layer of AlGaAs doped to have conductivity of said one polarity,
said first and second layers forming an electrically energizable light emitting junction,
said third, fourth and fifth layers forming light sensing means sensitive to light produced by said junction, and
said second and third layers meeting at a semiconductor-to-semiconductor interface separating said junction and said sensitive means,
first DC voltage source means having an output terminal of a first polarity and a common terminal of a second polarity,
second DC voltage source means having an output terminal of said second polarity and a common terminal of said first polarity,
common conductor means connecting said common terminals of said first and second voltage source means to said interface,
first conductor means including first impedance means connection said output terminal of said first voltage source means to said first layer,
second conductor means including second impedance means connecting said output terminal of said second voltage source means to said fifth layer, and
electrical signal processing means connected to said first and second impedance means and operable to produce an output signal indicative of the difference in voltage across said first impedance means and said second impedance means.

18. The apparatus of claim 17 wherein said one polarity is P, wherein said opposite polarity is N, wherein said first voltage polarity is positive, and wherein said second voltage polarity is negative.

19. The apparatus of claim 18 wherein said first and second impedance means comprise first and second resistance means,
wherein current flow through said first resistance means is indicative of energization of said junction and of the quantity of light being generated by said junction as a result of said energization, and
wherein current flow through said second resistance means is indicative of the total quantity of light being received by said sensing means.

20. The apparatus of claim 19 wherein resistance magnitudes are selected for said first and second resistance means such that said signal processing means is operable to produce an output signal that is independent of the state of energization of said junction.

21. The apparatus of claim 20 including
an optical fiber having one end thereof arranged adjacent to said first layer,
such that upon energization of said junction, said junction operates to emit light both into said one end of said optical fiber and into said sensing means, and
such that light that may be emitted from said one end of said optical fiber toward said first layer is sensed by said sensing means.

22. The apparatus of claim 17 wherein said one polarity is N, wherein said opposite polarity is P, wherein said first voltage polarity is negative, and wherein said second voltage polarity is positive.

23. The apparatus of claim 22 wherein said first and second impedance means comprise first and second resistance means,
wherein current flow through said first resistance means is indicative of a state of energization of said junction and of the quantity of light being generated by said junction as a result of said state of energization, and
wherein current flow through said second resistance means is indicative of the total quantity of light being received by said sensing means.

24. The apparatus of claim 23 wherein resistance magnitudes are selected for said first and second resistance means such that said signal processing means is operable to produce an output signal that is independent of the state of energization of said junction.

25. The apparatus of claim 24 including
an elongated optical fiber extending between two physical locations and having one end thereof arranged adjacent to said first layer,
such that upon energization of said junction, said junction operates to emit light into said one end of said optical fiber for transmission to the other end of said optical fiber, and said junction simultaneously operates to emit light onto said sensing means, and
such that light that may be emitted from said one end of said optical fiber toward said first layer is sensed by said sensing means.

26. Apparatus providing full duplex light communication between two spaced physical locations, comprising;
an elongated optical fiber extending between said two locations, a first end of said fiber being located at a first of said two locations, and a second end of said fiber being located at a second of said two locations,
means located at said second end of said fiber for selectively emitting light into said second end, and for sensing light that may emit from said second end, a semiconductor light emitting junction located at said first end of said fiber, such that upon energization of said junction, said junction operates to emit light into said first end of said fiber for transmission to said second end of said fiber, a semiconductor light sensor formed integrally with said junction such that said junction, when energized, emits light onto said light sensor to be sensed thereby, and such that light that is emitted from said first end of said fiber is also sensed by said light sensor, DC voltage source means for said light emitting junction and said light sensor, means including said DC voltage source means for selectively energizing said junction, and detecting means for detecting current flow between said DC voltage source means and said light emitting junction and said light sensor, and operable to provide an output independent of light that may be received from said sensor due to said selective energization of said junction, such that said output is indicative only of light emitted from said first end of said fiber onto said light sensor.

* * * * *